United States Patent [19]

Wei

[11] Patent Number: 5,326,724
[45] Date of Patent: Jul. 5, 1994

[54] OXIDE-CAPPED TITANIUM SILICIDE FORMATION

[75] Inventor: Che-Chia Wei, Wylie, Tex.

[73] Assignee: Texas Instruments Incorporated, Dallas, Tex.

[21] Appl. No.: 815,312

[22] Filed: Dec. 27, 1991

[51] Int. Cl.$^5$ .................... H01L 21/283; H01L 21/31
[52] U.S. Cl. .................... 437/200; 437/190; 437/228; 437/238; 148/DIG. 15; 148/DIG. 19; 156/653; 156/657
[58] Field of Search .............. 437/200, 190, 238, 228, 437/41; 148/DIG. 19, DIG. 147, DIG. 15; 357/675, 715; 156/653, 656, 657

[56] References Cited

U.S. PATENT DOCUMENTS

| | | | |
|---|---|---|---|
| 4,675,073 | 6/1987 | Douglas | 156/643 |
| 4,690,730 | 9/1987 | Tang et al. | 156/643 |
| 4,746,219 | 5/1988 | Holloway et al. | 357/23.11 |
| 4,920,073 | 4/1990 | Wei et al. | 437/200 |
| 4,923,822 | 5/1990 | Wang et al. | 437/41 |
| 4,963,502 | 10/1990 | Teng et al. | 437/41 |
| 4,988,643 | 1/1991 | Tsou | 437/200 |
| 4,994,402 | 2/1991 | Chiu | 437/41 |
| 5,010,032 | 4/1991 | Tang et al. | 437/57 |
| 5,034,348 | 7/1991 | Hartswick et al. | 437/200 |

OTHER PUBLICATIONS

Ghandhi, S. K., VLSI Fabrication Principles, 1983, John Wiley & Sons, pp. 475–527.
Sze, S. M., VLSI Technology, 1983, McGraw-Hill, pp. 336–339.

Primary Examiner—T. N. Quach
Attorney, Agent, or Firm—Stanton C. Braden; William E. Hiller; Richard L. Donaldson

[57] ABSTRACT

A titanium nitride layer is deposited between the metal titanium layer and the oxide cap of a conventional oxide capped titanium disilicide technology process. This titanium nitride layer is deposited in-situ after a certain thickness of metal titanium has been deposited by bleeding nitrogen gas into the titanium sputter machine. Thereafter the normal oxide cap is deposited over this titanium nitride layer. The normal titanium react process is performed to produce titanium disilicide. After the titanium disilicide has been produced, it is then necessary to strip off the oxide cap. The extra titanium nitride layer makes it is possible to use a wet etch to remove the oxide cap, with the titanium nitride layer serving as a etch stop. In this manner an isotropic wet etch may be employed to remove all of the oxide cap layer. The isotropic wet etch is preferably a 10% buffered HF etch.

20 Claims, 1 Drawing Sheet

OXIDE-CAPPED TITANIUM SILICIDE FORMATION

BACKGROUND OF THE INVENTION

This invention relates to integrated circuits and more particularly relates to methods for manufacturing integrated circuits.

Self-aligned refractory metal-silicide technology has been recognized as one of the keys to realizing good device performance in integrated circuits as device dimensions scale down. Titanium Disilicide ("TiSi$_2$") has become recognized as one of the most attractive metal-silicides, because of its low resistivity, stability, and capability for self-aligned formation.

One of the major advantages of titanium silicide technology is the availability of a self-aligned VLSI process. That is, by depositing a layer of titanium metal overall and then heating in a nitrogen atmosphere, all exposed areas of silicon (whether monocrystalline or polycrystalline) will react to form titanium silicides, and a composition dominated by titanium nitrides will be formed where the titanium metal was not in contact with silicon. This is tremendously useful, since, by performing this step after the polysilicon gate level has been patterned, silicide will be formed on the surface of exposed source/drain regions (or of other exposed substrate surface regions), on the surface of the polysilicon gate level, and no where else. This means that shallower source/drain diffusions can be made with an acceptably low sheet resistance, and also means that the sheet resistance of the polysilicon gate level can be lowered. The use of the nitrogen atmosphere in this process is critical, since otherwise silicon will out-diffuse through the growing silicide layer and permit lateral growth, so that the titanium silicide formed by this reaction will be able to bridge gaps of a one-half micron or so, e.g. between gate and source/drain of a VLSI device.

However, this self-aligned TiSi$_2$ technology is degraded by any oxygen contamination of the nitrogen atmosphere used for the silicide react process. It has been found that the oxygen contamination during the react process can result in two problems. First, the silicide will have a high resistivity. Second, the unreacted titanium (or non-silicide material such as titanium nitride) is hard to strip off.

U.S. Pat. No. 4,690,730 issued Sep. 1, 1987 and assigned to Texas Instruments Incorporated teaches a way to avoid any possible oxygen contamination. This patent teaches that the manufacturing process places an oxide cap on top of the titanium layer before the silicide react. During the react process, this oxide is partially reduced by the adjacent layer of titanium metal. Therefore, some oxygen will be freed and can diffuse into the titanium layer. In the low temperature of the react process, the oxygen is gettered at the grain boundaries of the titanium metal and will retard the silicon atom from outdiffusion across grain boundaries. The introduced oxygen impurity apparently performs a function partially analogous to that of the nitrogen in the traditional self-aligned TiSi$_2$ process. Another possibility for the retardation of the silicon atom from outdiffusion is the stress caused by the deposited oxide layer. The stress will prevent a volume change which is required during TiSi$_2$ formation in the Ti layer.

However, one of the shortcomings of the oxide cap process of the patent has to do with the plasma etch employed to remove the oxide cap. More particularly at the completion of the fabrication process, a plasma etch or oxide etch is used to remove the oxide layer. However, the plasma etch is anisotropic, since it is purely a vertical etch, i.e. the plasma etches down vertically along horizontal surfaces. However, portions of the circuit geometry involve nearly vertical surfaces which are covered by the oxide layer. Because the plasma etch is required to also etch off this nearly vertical oxide layer, it requires a very long over-etch. If these portions of the vertical oxide layer are not removed by the etch, then that leaves portions of the oxide layer covering the unreacted metal titanium. Then any subsequent steps to remove the titanium (because it is covered by unremoved portions of the oxide layer) leaves portions or filaments of metal titanium which then short out the circuitry, for short metal etches, or floating pieces of oxide that increase default density, for long metal etches.

These and other limitations and disadvantages of the prior art are overcome by the present invention, however, an improved method for oxide capped titanium silicide formation to manufacture integrated circuits is provided.

SUMMARY OF THE INVENTION

In a preferred embodiment of the present invention, a titanium nitride layer is deposited between the titanium layer and the oxide cap in a conventional oxide capped titanium disilicide technology process. The titanium nitride layer is deposited in-situ after a certain thickness of metal titanium has been deposited by bleeding nitrogen gas into the titanium sputter machine. A normal oxide cap is then deposited over this titanium nitride layer. Thereafter a normal titanium react process is performed to produce titanium disilicide. After the titanium disilicide has been generated, it is necessary to strip off the oxide cap. Because of the extra titanium nitride layer of the present invention it is now possible to use an isotropic wet etch to remove the oxide cap, with the titanium nitride layer serving as a etch stop. In this manner an isotropic wet etch may be employed to remove all of the oxide cap layer (without the shortcomings of the anisotropic plasma etch associated with the prior methods). The isotropic wet etch is preferably a 10% buffered HF etch.

It is an object of the present invention to provide an improved oxide capped titanium disilicide process that eliminates anisotropic dry etches of the oxide cap.

Accordingly, these and other objects and advantages of the present invention will become apparent from the following detailed description, wherein reference is made to the figures in the accompanying drawings.

DETAILED DESCRIPTION OF THE INVENTION

Figure 1:
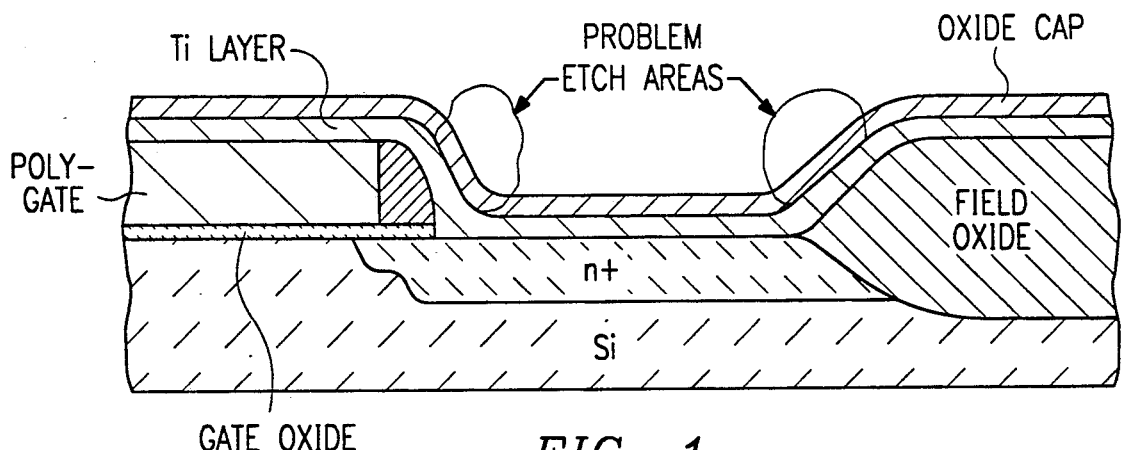
FIG. 1 is a cross-sectional view of a structure employed during conventional self-aligned oxide capped titanium disilicide fabrication processes employing a plasma dry etch to remove the oxide cap.

In order to make self-aligned $TiSi_2$ technology more manufacturable, various capped-silicidation fabrications methods have been proposed to prevent the possible oxygen contamination which will result in unacceptably high sheet resistance and filaments between moats and gates on an integrated circuit. Among those methods, oxide capped $TiSi_2$ technology (OCS) has been proven to be the most environmentally-insensitive process. That is, the OCS process does not require high purity purge gases, such as argon, in a furnace. FIG. 1 depicts the structure from the conventional OCS process of U.S. Pat. No. 4,690,730, described earlier herein before silicidation. However, in the OCS process, the cap oxide is etched off by a plasma dry etch which requires a heavy over etch to remove any possible cap oxide filaments. These possible oxide filaments are denoted in FIG. 1 as "problem etch areas" and encircled. Any cap oxide filaments may affect the ability of any subsequent wet stripping process to remove metal titanium resulting in shorting titanium filaments, or may result in floating pieces of oxide.

A wet etch for this oxide removal step is not possible because of the possibility of etching the underlying titanium disilicide layer and is therefore not employed. Because of the titanium disilicide substrate and the required heavy over etch, a normal plasma oxide etch process cannot be directly applied; a normal plasma oxide etch process generates a titanium polymer which inhibits uniform etching.

A compromise process which employs the etching of a few wafers and then the cleaning up of the etching electrodes may be possible. However, with such a compromise etch/cleanup step the throughput of the fabrication process is lowered without solving the particular problem of oxide cap removal. Additionally, a specially designed oxide cap etcher could possibly be employed to eliminate the polymer problem. However, such a specially designed oxide etcher would add to the production costs of the integrated circuits produced by the titanium disilicide process.

Figure 2:
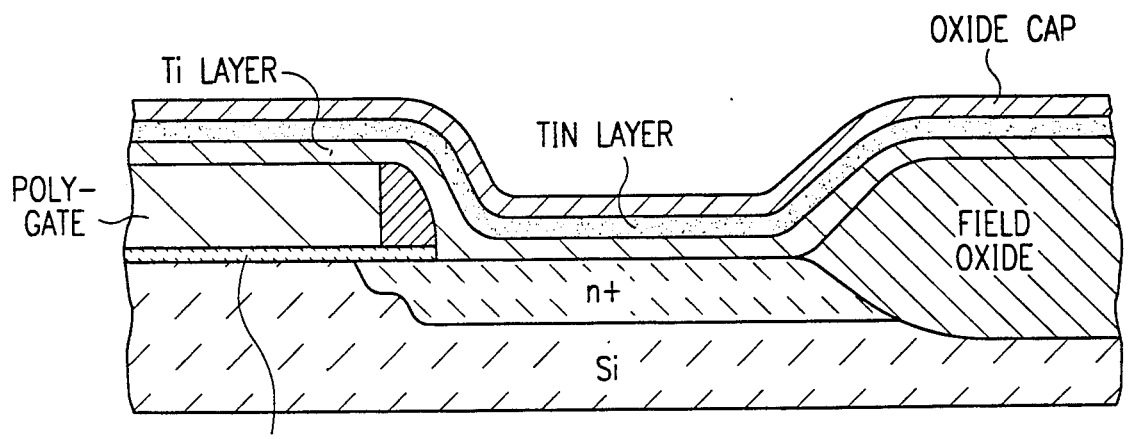
FIG. 2 is a cross-sectional view of the same structure of FIG. 1 during the improved fabrication process for an oxide capped titanium disilicide process of the present invention.
Figure 3:
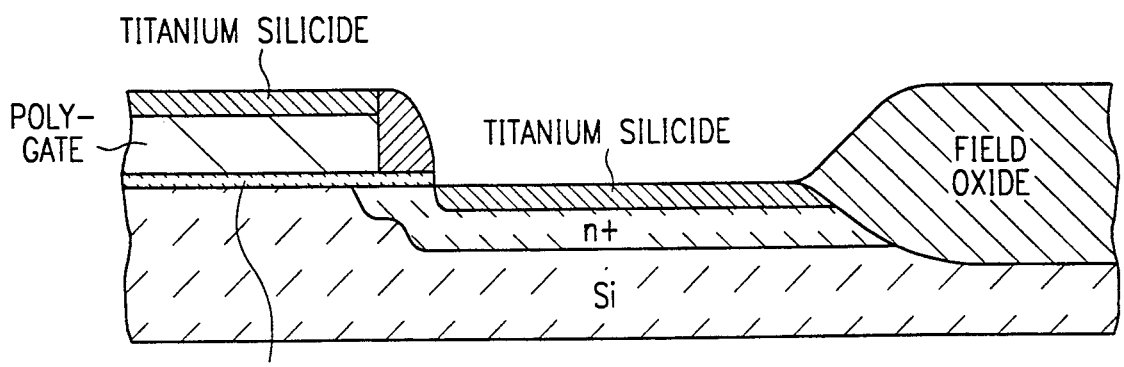
FIG. 3 is a cross-sectional view of the same structure of FIG. 2 after further processing steps.

It has been found that both titanium disilicide and titanium nitride are easily etched in HF Solutions. However, a 10% buffered HF solution does not attack titanium nitride over a short period, i.e. approximately 60 seconds, but does etch 1,000 to 2,000 angstroms of oxide during this same time interval. Because of this property, and in accordance with the teachings of the present invention, a titanium nitride layer may be inserted between the metal titanium layer and the cap oxide layer of the conventional OCS process. FIG. 2 depicts this titanium nitride layer and the other layers. The titanium nitride layer may be in-situ deposited after a selected thickness of metal titanium has been deposited by bleeding nitrogen gas into the sputter machine. Such an in-situ titanium nitride layer deposited on top of a metal titanium deposition layer has been successfully demonstrated in the laboratory.

After the deposition of the titanium nitride layer, the conventional oxide cap is deposited as described in U.S. Patent No. 4,690,730, which is incorporated herein by reference. Thereafter, the titanium react step occurs as described in the patent to form the titanium disilicide layers. Thereafter, an isotropic wet etch with buffered HF is employed to remove the oxide cap with the titanium nitride layer serving as etch stop. Thereafter, the titanium nitride layer and metal titanium layer are stripped by a convention wet chemical etch as described in the incorporated patent. The present invention avoids the problem of the prior plasma etch of leaving portions of cap oxide which may result in filaments of titanium metal that are not removed when the titanium layer is removed and that then short out the circuitry.

Although titanium nitride has been proposed as a preferred embodiment for an etch stop layer, other materials which have the following properties may also be employed as the etch stop of the present invention:

1. Materials that will not react with silicon at temperatures of about 700° C.,
2. Materials that will not be etched in a wet solution which can etch either an oxide or a nitride, and
3. Materials which can be stripped off by an RCA ($H_1O_2$: $NH_4OH + H_2O$) cleanup, or hot nitric acid.

Accordingly, the method of the present invention utilizes the property of a low etch rate of titanium nitride or similar materials in a buffered HF solution to allow for a wet oxide stripping step in the OCS process and therefore eliminate the problems encountered with a conventional dry oxide etch. The proposed in-situ deposition of titanium nitride on top of the titanium layer has been demonstrated and does not slow the throughput of the deposition in a fabrication process. It is presently believed that this improved OCS process is more manufacturable than the prior processees and has a larger process window.

Thus, the generic process steps of a preferred process of the present invention are to in-situ deposit a metal nitride layer on top of the metal layer deposited after a source/drain annealing step. The metal nitride layer may be approximately 1,000 angstroms thick and the metal layer may be approximately 800 angstroms thick. Clearly, alternative thicknesses of either the metal layer, the metal nitride layer, or both may be employed and still be within the scope of the present invention. The next process step is to use a low temperature process to deposit either silicon oxide, silicon nitride, alternating layers of both or some other dielectric to a thickness of approximately 1,000 angstroms on top of the metal nitride layer. Again, different thickness may be employed. The next step is to perform the silicide react process, which may be conveniently performed at 675° centigrade for approximately 30 minutes. Other temperatures and times may be employed. The next process step is to then wet etch selected portions of the dielectric material. The selected portions may be the entire layer. The next process step is to selectively strip any unreacted metal and the metal nitride layer by a wet chemical etch as is done in prior processes described in the patent. The final step is to then perform a silicide anneal at approximately 800° C. for approximately 30 minutes followed by continuing with conventional fabrication steps. Again, other temperatures and times may be employed.

The preferred process steps of a preferred titanium metal process of the present invention are to in-situ deposit a titanium nitride layer on top of the metal titanium layer deposited after the source/drain annealing step. The titanium nitride layer may be approximately 1,000 angstroms thick and the metal titanium layer may be approximately 800 angstroms thick. Clearly, alternative thicknesses of either the titanium layer, the titanium nitride, or both may be employed and still be within the scope of the present invention. The next process step is to use a low temperature process to deposit either silicon oxide, silicon nitride, or alternating layers of both to a thickness of approximately 1,000 angstroms on top of the titanium nitride layer. Again, other thicknesses of oxide or nitride may be employed in the process of the present invention and still be within the scope of the present invention. In addition, multiple layers of oxide and nitride may be deposited, each of varying thicknesses, to form a single laminated composite dielectric layer. The next step is to perform the silicide react process, which may be conveniently performed at 675° centigrade for approximately 30 minutes. The next process step is to then wet etch at least selected portions of the nitride or oxide cap material; for an oxide cap a buffered HF solution may preferably be employed and for a nitride cap a hot phosphorus acid wet etch may preferably be employed. The next process step is to selectively strip any unreacted metal titanium and the titanium nitride layer by a wet chemical etch as is done in prior processes described in the patent. The final step is to then perform a silicide anneal at approximately 800° C. for approximately 30 minutes followed by continuing with conventional fabrication steps.

The titanium metal does not have to be strictly pure titanium, but may instead be any one of a wide range of titanium alloys or pseudo alloys, as long as its chemistry is dominated by titanium, such as, for example, but not limited to Ti:V and Ti:Al alloys. Other intermetallic titanium compositions such as Ti:Y or Ti:W may also be usable.

It is possible that the teachings of the present invention may be extended to metals other than titanium. In general, any metal which 1. forms a conductive silicide,
2. will not allow silicon diffusion (at temperatures suitable for silicide formation) if the metal is passivated with oxygen, and
3. can reduce silicon oxides (at temperatures suitable for silicide formation), is a candidate for use in the methods of the present invention. Although titanium is the only metal known so far to meet these requirements, and the present invention does give tremendous advantages when used with titanium (or titanium alloys), the teachings of the present invention may be applied to other suitable metals.

Many other variations and modifications may be made in the apparatus and techniques hereinbefore described by those having experience in this technology, without departing from the concept of the present invention. Accordingly, it should be clearly understood that the methods depicted in the accompanying drawings and referred to the in the foregoing description are illustrative only and are not intented as limitations on the scope of the invention.

What is claimed is:

1. A method for fabricating integrated circuit devices, comprising the steps of:
    providing a substrate having thereon a partially fabricated integrated circuit structure, said structure including exposed portions consisting essentially of silicon;
    depositing a metal layer over said exposed portions;
    depositing a metal nitride layer over said metal layer;
    providing a dielectric layer directly overlying said metal nitride layer, said dielectric layer comprising an oxide;
    applying heat until portions of said metal layer react with portions of said exposed silicon to form metal silicides wherein said dielectric layer suppresses substantial silicon out diffusion through metal layer; and
    removing selected portions of said dielectric layer by means of an etch process using buffered HF solution applied for about 60 seconds or less.

2. The method of claim 1, wherein said metal is capable of forming a conductive silicide by thermal reaction, not allowing silicon diffusion through said metal at temperatures suitable for said silicide formation if said metal is passivated with oxygen and, being capable of reducing $SiO_2$ at temperatures suitable for silicide formation.

3. The method of claim 1, wherein said metal is predominantly titanium.

4. The method of claim 3 wherein said titanium layer comprises a titanium alloy.

5. The method of claim 1, wherein said step of removing selected portions of said dielectric layer comprises the step of removing the entire dielectric layer.

6. The method of claim 1, wherein said etch process uses a 10% buffered HF solution.

7. The method of claim 1, wherein said dielectric layer comprises silicon oxides.

8. The method of claim 7 wherein said step of providing a dielectric layer comprises depositing an oxide layer.

9. The method of claim 1, wherein said dielectric layer is a layered structure having silicon oxides proximate said metal layer.

10. The method of claim 1, wherein said dielectric layer is a low-density silicon oxide.

11. The method of claim 1 wherein said step of applying heat to form metal silicides comprises heating said structure to about 675° C.

12. The method of claim 1 wherein said step of applying heat to form metal silicides comprises heating said structure for about 30 minutes.

13. The method of claim 1 and further comprising the step of selectively stripping any unreacted metal and metal nitride layers.

14. The method of claim 13 wherein said step of selectively stripping any unreacted metal and metal nitride layers comprises the selectively stripping by a wet chemical etch.

15. The method of claim 1 and further comprising the step of heating said structure to anneal said metal silicide.

16. The method of claim 15 wherein said step of heating said structure to anneal said metal silicide comprises heating said structure to about 800° C.

17. The method of claim 15 wherein said step of heating said structure to anneal said metal silicide comprises heating said structure for about 30 minutes.

18. The method of claim 1 wherein said dielectric layer comprises alternating layers of silicon oxide and silicon nitride.

19. A method for fabricating integrated circuit devices, comprising the steps of:
    providing a substrate having a partially fabricated integrated circuit structure thereon, said structure including exposed portions consisting essentially of silicon;
    depositing a metal layer over said exposed portions;
    depositing a metal nitride layer over said metal layer;
    providing a dielectric layer directly overlying said metal nitride layer, sad dielectric layer comprising an oxide;

heating said structure until portions of said metal layer react with portions of said exposed silicon to form metal silicides wherein said dielectric layer suppresses substantial silicon out diffusion through metal layer; and etching said dielectric layer by means of a wet etch process such that said metal nitride serves as an etch stop.

20. The method of claim 19 wherein:
said substrate comprises a silicon substrate;
said metal layer comprises a titanium layer; and
said metal nitride layer comprises a titanium nitride layer.

* * * * *